United States Patent
Guillaume et al.

(10) Patent No.: US 11,595,041 B1
(45) Date of Patent: Feb. 28, 2023

(54) APPARATUS AND METHOD FOR PROVIDING POWER ISOLATION BETWEEN A POWER INPUT AND A PROTECTED SWITCH

(71) Applicant: Arm Limited, Cambridge (GB)

(72) Inventors: Jacques Bernard Claude Guillaume, Roquefort-les-Pins (FR); Mikael Yves Marie Rien, Bernin (FR); Fabio Toni Braz, Mougins (FR); Jeremy Patrick Dubeuf, Antibes (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/487,550

(22) Filed: Sep. 28, 2021

(51) Int. Cl.
*H03K 17/687* (2006.01)

(52) U.S. Cl.
CPC ..... *H03K 17/6872* (2013.01); *H03K 17/6874* (2013.01)

(58) Field of Classification Search
CPC ............ H03K 17/6872; H03K 17/6874; Y02T 10/70; Y02T 10/7072
See application file for complete search history.

(56) References Cited

U.S. PATENT DOCUMENTS

| 5,933,028 A * | 8/1999 | Kushiyama ........ H03K 19/0013 327/333 |
| 10,924,261 B2 | 2/2021 | Harrison et al. |
| 10,997,322 B2 | 5/2021 | Fleming et al. |

* cited by examiner

*Primary Examiner* — Jung Kim
(74) *Attorney, Agent, or Firm* — Nixon & Vanderhye P.C.

(57) ABSTRACT

There is provided an apparatus and method, the apparatus comprising a power input and a switch isolation circuit to provide isolation between the power input and a protected switch responsive to a timing signal. The switch isolation circuit comprises a switch isolation charge store, and a buffer circuit to receive power from the switch isolation charge store and coupled between the timing signal and the protected switch. The switch isolation circuit is configured to, in response to the timing signal having the first value, operate in a powered mode in which the switch isolation charge store receives power from the power input; and, in response to the timing signal having the second value, operate in an isolation mode in which the switch isolation charge store is isolated from the power input.

18 Claims, 7 Drawing Sheets

APPARATUS AND METHOD FOR PROVIDING POWER ISOLATION BETWEEN A POWER INPUT AND A PROTECTED SWITCH

TECHNICAL FIELD

The present invention relates to data processing. More particularly the present invention relates to power isolation.

BACKGROUND

Apparatuses for power isolation provide a power output that is electrically isolated from a power input. This can be achieved, for example, using an isolation circuit comprising a charge store that is charged from a power input whilst isolating a power output and that outputs power to the power output whilst isolating the power input. Such techniques provide power isolation by filtering signals from the power output side such that they are more difficult to detect at the power input.

SUMMARY

In configurations there is provided an apparatus comprising:
  a power input;
  a switch isolation circuit to provide isolation between the power input and a protected switch configured to close in response to a timing signal having a first value and to open in response to the timing signal having a second value, the switch isolation circuit comprising a switch isolation charge store, and a buffer circuit configured to receive power from the switch isolation charge store and coupled between the timing signal and the protected switch, wherein the switch isolation circuit is configured to:
    in response to the timing signal having the first value, operate in a powered mode in which the switch isolation charge store is configured to receive power from the power input; and
    in response to the timing signal having the second value, operate in an isolation mode in which the switch isolation charge store is isolated from the power input.

In some configurations there is provided a method of operating an apparatus comprising a power input and a switch isolation circuit, the method comprising:
  providing isolation between the power input and a protected switch configured to close in response to a timing signal having a first value and to open in response to the timing signal having a second value, the switch isolation circuit comprising a switch isolation charge store, the isolation comprising a switch isolation charge store, and a buffer circuit configured to receive power from the switch isolation charge store and coupled between the timing signal and the protected switch;
  operating the switch isolation circuit, in response to the timing signal having the first value, in a powered mode in which the switch isolation charge store receives power from the power input; and
  operating the switch isolation circuit, in response to the timing signal having the second value, in an isolation mode in which the switch isolation charge store is isolated from the power input.

BRIEF DESCRIPTION OF THE DRAWINGS

The present invention will be described further, by way of example only, with reference to embodiments thereof as illustrated in the accompanying drawings, in which.

DESCRIPTION OF EXAMPLE EMBODIMENTS

Figure 1:
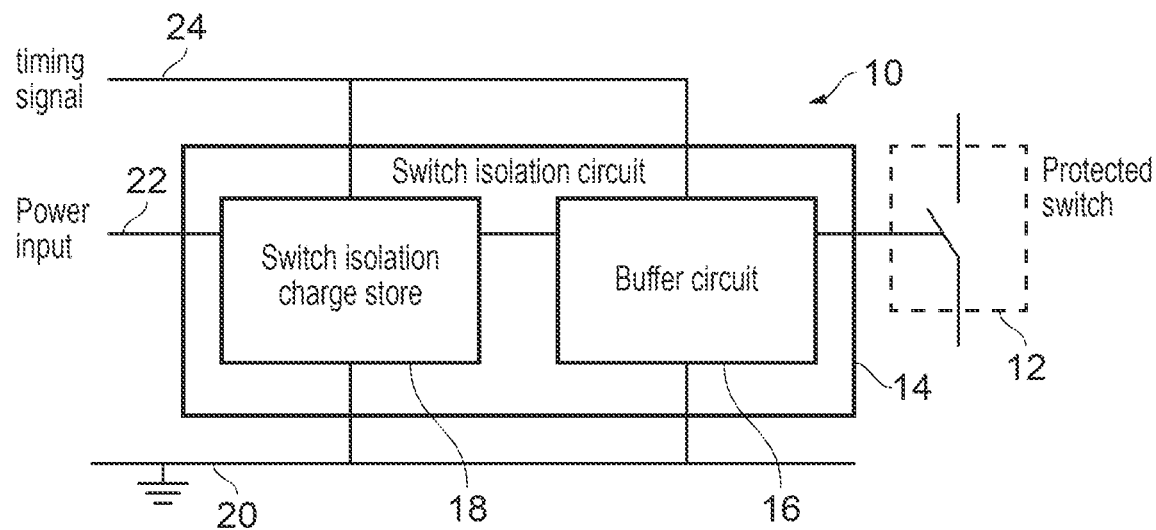
FIG. 1 schematically illustrates an apparatus for power isolation according to various configurations of the present techniques.

Before discussing the embodiments with reference to the accompanying figures, the following description of embodiments is provided.

In accordance with one example configuration there is provided an apparatus comprising: a power input and a switch isolation circuit to provide isolation between the power input and a protected switch. The protected switch is configured to close in response to a timing signal having a first value and to open in response to the timing signal having a second value. The switch isolation circuit comprises a switch isolation charge store, and a buffer circuit configured to receive power from the switch isolation charge store. The buffer circuit is coupled between the timing signal and the protected switch. The switch isolation circuit is configured to, in response to the timing signal having the first value, operate in a powered mode in which the switch isolation charge store is configured to receive power from the power input. The switch isolation circuit is further configured to, in response to timing signal having the second value, operate in an isolation mode in which the switch isolation charge store is isolated from the power input.

The protected switch is any switch controlled by a timing signal and is an electrical component that can transition between a closed state, in which current is allowed to flow between terminals of the protected switch, and an open state in which current flow between the terminals of the protected switch is restricted. The inventors of the present techniques have realised that, where protected switches are provided that are controlled by a timing signal, it is possible to determine properties of circuitry comprising the protected switch through an analysis of leakage current drawn through the signal controlling the protected switch. The present techniques therefore provide a buffer circuit that is coupled in between the timing signal and the signal controlling the protected switch. The buffer is an active electronic component that provides power obfuscation between the timing signal and the signal controlling the protected switch. In addition, the inventors have realised that the provision of a buffer circuit does not completely obfuscate power drawn by the switch as this information could theoretically be ascertained by measuring the power that is drawn by the buffer circuit. For this reason the inventors of the present techniques have provided the buffer as part of a switch isolation circuit that operates to provide a further level of power obfuscation by using a switch isolation charge store.

The switch isolation circuit is responsive to the timing signal to operate in a powered mode and an isolation mode. In the powered mode, the switch isolation charge store is connected to, and charged from, the power input. In addition, the buffer circuit is directly powered by the power input. In the isolation mode, the switch isolation charge store is isolated from (disconnected from) the power input. In the isolation mode the buffer circuit is also isolated from the power input and is instead powered from the switch isolation charge store. The mode of the switch isolation circuit is therefore synchronised with the timing signal and, hence, the protected switch. When the timing signal takes the first value (for example a logical one or a logical zero) the protected switch is closed and the switch isolation circuit operates in the powered mode. When the timing signal takes the second value (for example a logical zero or a logical one, i.e., the inverse of the first value), the protected switch is open, allowing current to flow between the terminals of the protected switch, and the switch isolation circuit operates in the isolation mode. The mode of the switch isolation circuit and the protected switch are synchronised in this way because it has been determined that, when the protected switch is open, current is able to leak between the terminals of the switch and the buffer circuit. Hence, by operating the protected circuitry in the isolation mode when the protected switch is open, the leakage current can be obfuscated from the power input. As a result, the switch isolation circuit adds a further level of obfuscation making it increasingly difficult to determine the current leaking through the protected switch. The first value of the timing signal and the second value can be values dependent on the type of switch that is used for the power isolation switch. In some configurations the first value is a logical one and the second value is a logical zero. In other configurations the first value is a logical zero and the second value is a logical one. In further configurations the first value and the second value are each analogue values of different voltages.

The placement of the switch isolation charge store and the switching of the switch isolation charge store can be variously defined. However, in some configurations the buffer circuit is configured to receive power from the switch isolation charge store independent of whether the switch isolation circuit is operating in the powered mode or the isolation mode. In other words, the switch isolation charge store is positioned such that a first terminal of the switch isolation charge store is coupled (connected) to a first power input terminal of the buffer circuit and a second terminal of the switch isolation charge store is coupled (connected) to a second power input terminal (ground terminal) of the buffer circuit.

The protected switch can be any switch provided within circuitry for which it may be possible to determine protected operational parameters, or other circuit properties, through the measurement of the current drawn by the protected switch. However, in some configurations, the apparatus further comprises a power output; and power isolation circuitry comprising a power isolation charge store and configured to switch between a power receiving mode and a power isolation mode using the protected switch, wherein in the power receiving mode the power isolating charge store is coupled to the power input and is electrically isolated from the power output, and in the power isolation mode the charge store is coupled to the power output and is electrically isolated from the power input. The power isolation circuit therefore provides a level of power obfuscation between the power input and the power output. In particular, the operation of the power isolation circuitry results in the power input being isolated from the power output when the power isolation circuit is operating in the power receiving mode and when the power isolation circuitry is operating in the power isolation mode. In particular, the protected switch operates to switch the power isolation charge store between being connected to the power input, whilst isolated (disconnected) from the power output, and being connected to the power output, whilst isolated (disconnected) from the power input. The role of the power isolation circuitry is to make it difficult to determine current drawn at the power output by measuring the current at the power input. A vulnerability of such circuits is that, even when it is difficult to determine current drawn by measuring the current at the power input, information relating to the current that is being drawn at the power output can be determined based on the current leakage through the protected switch. The present techniques make such a determination difficult by providing a further level of obfuscation in the form of the switch isolation circuit. Hence, the use of the switch isolation circuit to control a protected switch in the power isolation circuitry, a higher degree of power obfuscation can be obtained.

In some example configurations the timing signal is an input side timing signal, the switch isolation circuit is an input side switch isolation circuit of a plurality of switch isolation circuits, and the protected switch is an input side protected switch coupled between the power input and a first terminal of the power isolation charge store; the apparatus further comprises an output side protected switch coupled between the first terminal of the power isolation charge store and the power output, and an output side switch isolation circuit to provide isolation between the power input and the output side protected switch; and the output side protected switch is configured to close in response to the output side timing signal having the first value and to open in response to the output side timing signal having the second value. The power isolation charge store is therefore connected to the power input via the input side protected switch which, in turn, is controlled by the input side timing signal obfuscated by the input side switch isolation circuit. The power isolation charge store is also connected to the power output via the output side protected switch which, in turn, is controlled by the output side timing signal obfuscated by the output side switch isolation circuit.

In some configurations the apparatus further comprises timing circuitry to generate the input side timing signal and the output side timing signal from a common clock signal, wherein the timing control circuitry is configured to cause the input side timing signal to have the second value when the output side timing signal has the first value, and to cause the output side timing signal to have the second value when the input side timing signal has the first value. In other words, the input side timing signal and the output side timing signal are the inverse of one another such that one of the input side protected switch and the output side protected switch is closed whilst the other of the input side protected switch and the output side protected switch is open. In some configurations the first timing signal and the second timing signal are non-overlapping signals configured such that the input side protected switch and the output side protected switch cannot be closed at a same time, to ensure isolation between the power input and the power output within the power isolation circuitry, but the input side protected switch and the output side protected switch can be open at the same time. In such a configuration a further charge store can be provided at the power output to ensure a continuous supply of power from the power isolation circuit.

In some configurations the apparatus further comprises a shorting protected switch coupled between the first terminal of the power isolation charge store and a second terminal of the power isolation charge store, and a shorting isolation circuit to provide isolation between the power input and the shorting protected switch; and the shorting protected switch is configured to close in response to the shorting timing signal having the first value and to open in response to the shorting timing signal having the second value. The provision of a shorting protected circuit connected across the power isolation charge store enables the charge in the power isolation charge store to be refreshed. When the shorting protected switch is closed there is a direct path for current to flow from one terminal of the power isolation charge store to the other. Closing the shorting protected switch therefore causes the charges in the charge store to equilibrate. Refreshing the charges in the charge isolation charge store provides a further level of obfuscation in the power isolation circuitry. In particular, if the charges in the charge store are refreshed, it is not easy for an observer measuring current at the power input to determine whether charge has been used due to the functioning of circuitry connected to the power output or whether the charge has been used due to shorting through the shorting protected switch. Furthermore, by providing a shorting isolation circuit obfuscates the leakage of charge through the shorting protected switch when the shorting protected switch is open. Hence, the charge in the power isolation charge store cannot be easily estimated based on the charge leaking through the shorting protected switch.

In some configurations the apparatus further comprises timing circuitry to generate the input side timing signal, the output side timing signal, and the shorting timing signal from a common clock signal, wherein the timing control circuitry is configured to: when the input side timing signal has the first value, cause the output side timing signal to have the second value, and cause the shorting timing signal to have the second value; when the output side timing signal has the first value, cause the input side timing signal to have the second value, and cause the shorting timing signal to have the second value; and when the shorting timing signal has the first value, cause the output side timing signal to have the second value, and cause the input side signal to have the second value. In some configurations the first timing signal, the second timing signal, and the shorting timing signal are non-overlapping signals configured such that no more than one of the input side protected switch, the output side protected switch, and the shorting protected switch are closed at a same time. This ensures isolation between the power input and the power output within the power isolation circuitry and prevents the shorting of the terminals of either the power input or the power output. In such a configuration a further charge store can be provided at the power output to ensure a continuous supply of power from the power isolation circuit.

In some configurations, the power input comprises a first input power signal and a second input power signal; the input side protected switch is a first input side protected switch coupled between the first terminal of the power isolation charge store and the first input power signal; and the power isolation circuit further comprises a second input side protected switch operating in phase with the first input side protected switch and coupled between a second terminal of the power isolation charge store and the second power signal. In order to provide a complete circuit, the power input requires two input signals (the first power input signal and the second power input signal). Information regarding the power consumption of circuitry connected at the power output can be determined by measuring current input at the first input power signal or the second input power signal. Hence, by providing first and second input side protected switches controlled by a same input side timing signal a further level of obfuscation can be obtained using the power isolation circuitry in combination with the input side switch isolation circuitry.

In some configurations the power output comprises a first output power signal and a second output power signal; the output side protected switch is a first output side protected switch coupled between the first terminal of the power isolation charge store and the first output power signal; and the power isolation circuit further comprises a second output side protected switch operating in phase with the first output side protected switch and coupled between the second terminal of the power isolation charge store and the second power signal. The provision of first and second output side protected switches provides a further level of obfuscation between the power input and the power output. In some configurations the first and second output side protected switches can be provided in combination with the first and second input side protected switches.

In some configurations the apparatus further comprises protected circuitry configured to receive power from the power output. The power drawn by the protected circuitry can, in this way, be obfuscated such that it cannot be determined through measurements at the power input or by power measurements on the signals that control the protected switches.

In some configurations the power isolation circuit operates as a low frequency isolation circuit. The low frequency isolating circuit prevents low frequency components of the power consumed at the power output from being detected at the power input.

In some configurations the apparatus comprises a further power isolation circuit coupled between the power isolation circuit and the power output and configured to output an output voltage signal at the power output of lower voltage than an intermediate voltage signal output from the power isolation circuit, wherein the further power isolation circuit is configured to generate the output voltage signal by filtering the intermediate voltage signal to reduce signal components at a switching frequency of the protected switch. The further power isolation circuit reduces the voltage provided as the intermediate voltage signal and, by arranging the second isolation circuit such that the intermediate voltage is filtered to reduce signal components at the switching frequency, an output voltage that is stable over a range of intermediate voltages can be provided. As a result, the size of components required to obtain a stable voltage over a range of frequencies can be reduced resulting in a power obfuscation circuit with improved power efficiency. In some example configurations the power input is provided with an input voltage defined in an input voltage range. The intermediate voltage, that is output from the power isolation circuit, will therefore vary between a peak voltage defined by the input voltage and a minimum that is based on the switching frequency and the current drawn at the power output. The further isolation circuit filters the intermediate voltage to reduce frequency components at the switching frequency to output a stable voltage in an output voltage range that is lower than the input voltage range.

In some configurations the apparatus further comprises timing generation circuitry to generate the timing signal, wherein the timing generation circuitry comprises a linear feedback shift register to cause a variation in a switching frequency of the timing signal between a minimum switching frequency and a maximum switching frequency. The linear feedback shift register is a shift register that is driven by a clock signal operating at the maximum switching frequency. The input bit of the shift register is driven using a logical function of a set of bits of the overall shift register value. In some example configurations the linear feedback shift register is driven by an XOR (exclusive or) of a subset of the bits of the shift register. The linear feedback shift register generates a stream of values in a repeating cycle. The length of the cycle is dependent on the feedback function used and the length of the shift register. In some example configurations a fixed stream with a cycle length of 512 clock cycles is used to generate the variation in the switching frequency. The switching frequencies are chosen such that they are sufficiently high that the charge stored in the power isolation charge store and charge stored in the switch isolation charge store are not completely depleted when operating in the isolation mode. When operated at lower switching frequencies the charge remaining in the power isolation charge store and the charge remaining in the switch isolation charge store will be lower when the timing signal switches from the second value to the first value and, hence, will draw a greater current each time it is charged. In contrast, when operated at the higher frequencies the charge remaining in the power isolation charge store and the switch isolation charge store will be higher when the timing signal switches from the second value to the first value and, hence, will draw a lower current each time it is charged. This approach provides a further level of obfuscation that reduces the dependence of the power output from the power input.

In some configurations the further power isolation circuit is configured as a band pass filter with a pass band based on a difference between the minimum switching frequency and the maximum switching frequency. The further isolation circuit configured in this way allows variations at the variation frequency to pass. In this way an output voltage can be generated that is dependent on the variation frequency. As a result, the power drawn by circuitry connected to the power output is dependent on both the power characteristic of the circuitry and the variation frequency. For configurations in which the variation frequency is generated based on a linear feedback shift register the power consumption of the circuitry is rendered dependent on variation and cycle length of the linear feedback shift register.

In some configurations the power isolation circuit is one of a plurality of power isolation circuits each comprising a protected switch operated by the switch isolation circuit. The operation mode (power receiving mode or power isolation mode) of each of the power isolation circuits is time dependent and each of the power isolation circuits alternates between the power receiving mode and the power isolation mode in synchronisation with the operational mode of the switch isolation circuitry. In some example configurations each power isolation circuit is configured to operate in one of the power receiving mode and the power isolation mode at a given time and each power isolation circuit is configured to alternate between these modes as described hereinabove. Furthermore, in some example configurations a plurality of further isolation circuits is also provided, each further isolation circuit is coupled to a corresponding power isolation circuit via a corresponding intermediate voltage node. Each corresponding pair of power isolation circuits and further isolation circuits are connected in parallel between the power input and the power output and each of the power isolation circuits is provided with one or more switch isolation circuits. By providing plural power isolation circuits and (optionally) plural further isolation circuits a further level of power obfuscation can be achieved.

The protected switch (or protected switches) can be provided using a variety of different electronic components. In some configurations transistors are used for the protected switches. In other configurations the protected switch is a CMOS switch. In some configurations the protected switch can be provided by an N-type CMOS switch or a P-type CMOS switches.

In some configurations the protected switch is coupled to a current pathway and a leakage current associated with the protected switch is correlated with a processing state of protected circuitry comprising the protected switch. Hence, the switch isolation circuit acts to isolate the protected switch from the power input when the protected switch is open, i.e., for the time during which the leakage current is measurable across the protected switch.

In some example configurations there is provided a non-transitory computer-readable medium storing computer-readable code for fabrication of the apparatus as described herein.

Concepts described herein may be embodied in computer-readable code for fabrication of an apparatus that embodies the described concepts. For example, the computer-readable code can be used at one or more stages of a semiconductor design and fabrication process, including an electronic design automation (EDA) stage, to fabricate an integrated circuit comprising the apparatus embodying the concepts. The above computer-readable code may additionally or alternatively enable the definition, modelling, simulation, verification and/or testing of an apparatus embodying the concepts described herein.

For example, the computer-readable code for fabrication of an apparatus embodying the concepts described herein can be embodied in code defining a hardware description language (HDL) representation of the concepts. For example, the code may define a register-transfer-level (RTL) abstraction of one or more logic circuits for defining an apparatus embodying the concepts. The code may define a HDL representation of the one or more logic circuits embodying the apparatus in Verilog, SystemVerilog, Chisel, or VHDL (Very High-Speed Integrated Circuit Hardware Description Language) as well as intermediate representations such as FIRRTL. Computer-readable code may provide definitions embodying the concept using system-level modelling languages such as SystemC and SystemVerilog or other behavioural representations of the concepts that can be interpreted by a computer to enable simulation, functional and/or formal verification, and testing of the concepts.

Additionally or alternatively, the computer-readable code may embody computer-readable representations of one or more netlists. The one or more netlists may be generated by applying one or more logic synthesis processes to an RTL representation. Alternatively or additionally, the one or more logic synthesis processes can generate from the computer-readable code a bitstream to be loaded into a field programmable gate array (FPGA) to configure the FPGA to embody the described concepts. The FPGA may be deployed for the purposes of verification and test of the concepts prior to fabrication in an integrated circuit or the FPGA may be deployed in a product directly.

The computer-readable code may comprise a mix of code representations for fabrication of an apparatus, for example including a mix of one or more of an RTL representation, a netlist representation, or another computer-readable definition to be used in a semiconductor design and fabrication process to fabricate an apparatus embodying the invention. Alternatively or additionally, the concept may be defined in a combination of a computer-readable definition to be used in a semiconductor design and fabrication process to fabricate an apparatus and computer-readable code defining instructions which are to be executed by the defined apparatus once fabricated.

Such computer-readable code can be disposed in any known transitory computer-readable medium (such as wired or wireless transmission of code over a network) or non-transitory computer-readable medium such as semiconductor, magnetic disk, or optical disc. An integrated circuit fabricated using the computer-readable code may comprise components such as one or more of a central processing unit, graphics processing unit, neural processing unit, digital signal processor or other components that individually or collectively embody the concept.

Particular embodiments will now be described with reference to the figures.

FIG. 1 schematically illustrates an apparatus 10 according to various configurations of the present technique. The apparatus 10 is provided with a switch isolation circuit 14 to control a protected switch 12. The switch isolation circuit 14 is coupled to a power input 22, a ground signal 20 and a timing signal 24. The switch isolation circuit 14 is provided with a switch isolation charge store 18 and a buffer circuit 16. The protected switch 12 is configured to close in response to the timing signal 24 taking a first value and is configured to open in response to the timing signal 24 taking a second value. The buffer circuit 16 is coupled between the timing signal 24 and the protected switch 12 and receives power from the power input 22, via the switch isolation charge store 18. The switch isolation circuit 14 is configured to, when the timing signal 24 has the first value, operate in a powered mode in which the switch isolation charge store 18 receives power from the power input 22 and, when the timing signal 24 has the second value, operate in an isolation mode in which the switch isolation charge store 18 is isolated from the power input 22.

The switch isolation circuit 14 acts to prevent leakage current from the protected switch 12 from being measurable at the power input 22. The buffer circuit 16 provides this isolation in combination with the switch isolation charge store 18. In particular, when the protected switch 12 is open, the switch isolation charge store is disconnected (isolated) from the power input 22 and the buffer circuit receives power from the switch isolation charge store. Hence, the current leaking through the protected switch 12, when the protected switch 12 is open, cannot be measured at the power input 22 due to the isolation between the power input 22 and the protected switch 12 that is provided by the switch isolation circuit 14.

Figure 2:
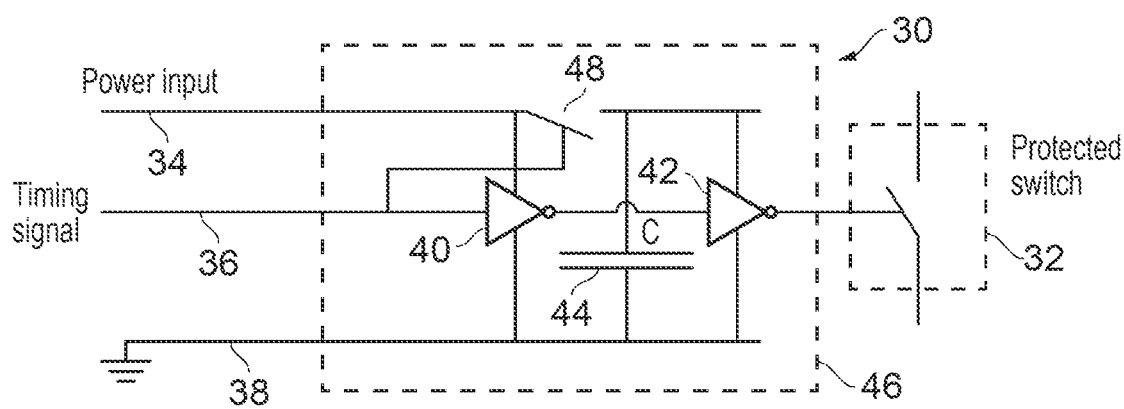
FIG. 2 schematically illustrates details of an apparatus for providing power isolation between a power input and a protected switch according to various configurations of the present techniques.

FIG. 2 schematically illustrates details of an apparatus 30 according to various example configurations. The apparatus 30 comprises a protected switch 32 and switch isolation circuit 46. The switch isolation circuit is coupled to the power input 34, the timing signal 36 and a ground signal 38. The switch isolation circuit 46 comprises a capacitor 44 (switch isolation charge store), a first inverter 40, a second inverter 42 (buffer circuit) and a switch 48. The switch 48 is responsive to the timing signal 36 such that, when the timing signal is at a logical 1 the switch 48 is closed and power can flow from the power input 34 to provide power to the capacitor 44 and the second inverter 42. The timing signal 36 is input into the first inverter 40 which receives power from the power input 34 and the ground signal 38. The output of the first inverter 40 is input into the second inverter 42. The output from the second inverter 42 is given by the timing signal 36 inverted twice and, hence, is in phase with the timing signal 36. The output from the second inverter 42 controls the protected switch 32. In particular, when the timing signal is at a logical 1, the protected switch 32 is closed and current can flow through the protected switch. The protected switch 32 and the switch 48 are therefore synchronised such that when the switch 48 is closed the protected switch 32 is closed and when the switch 48 is open the protected switch 32 is also open.

The apparatus 30 has two modes of operation: a powered mode and an isolation mode. When in the powered mode the timing signal 36 is at a logical 1 causing the switch 48 to close. When the switch 48 is closed, the capacitor 33 is charged from the power input and the second inverter 42 is powered by the power input 34. The timing signal 36 is inverted twice (once by the first inverter 40 and once by the second inverter 42) and provides a logical 1 to the protected switch 32 causing the protected switch 32 to be closed. As the protected switch 32 is closed, current flows between the terminals of the protected switch and there is negligible leakage current measured at the power input. When in the isolation mode the timing signal 36 is at a logical 0 causing the switch 48 to open. When the switch 48 is open, the second inverter 42 is powered by the capacitor 44 which discharges as the second inverter 42 draws power. The timing signal 36 is inverted twice (once by the first inverter 40 and once by the second invertor 42) to provide a logical 0 at the input to the protected switch 32 causing the protected switch 32 to be open. The leakage current across the protected switch 32 cannot be detected at the power input 48 as the power input 48 is isolated from the second inverter 42.

Figure 3:
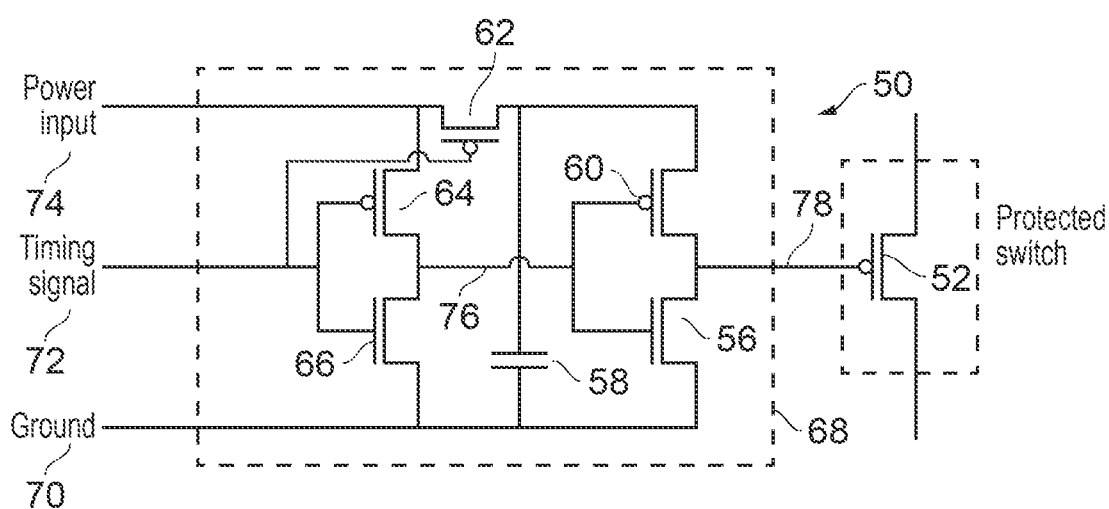
FIG. 3 schematically illustrates details of an apparatus for providing power isolation between a power input and a protected switch according to various configurations of the present techniques.

FIG. 3 schematically illustrates further detail of an apparatus 50 according to various configurations of the present techniques. The operation of the circuit illustrated in FIG. 3 is similar to the operation of the circuit in FIG. 2. The protected switch 52 is provided by an P-type CMOS switch. The switch isolation circuit 68 is coupled to the power input 74, the ground signal 70, and the timing signal 72. The switch isolation circuit 68 comprises a capacitor 58 (switch isolation charge store) a switch 62 provided by an P-type CMOS switch, a first inverter provided by CMOS switches 64 and 66, and a second inverter (buffer circuit) provided by CMOS switches 60 and 56. The timing signal 72 is configured to provide, as a logical 1, a voltage that is close to the power input 74 and, as a logical 0, a voltage that is close to the ground voltage 70. Each of the first inverter and the second inverter is provided with an N-type CMOS switch 66, 56 and a P-type CMOS switch 64, 60. The gates of the N-type CMOS switches 66, 56 and the respective P-type CMOS switches 64, 60 are connected together to form the inputs to the first invert and the second inverter respectively.

When the input is at a logical 1 current is able to flow between the source and the drain of the N-type CMOS switches 66 and 56 but is restricted from flowing between the source and the drain of the P-type CMOS switches 64, 60. Hence, when a logical 1 is supplied by the timing signal 72, the P-type CMOS switch 64 is off (as current flow between the source and the drain is restricted) and the N-type CMOS switch 66 is on (as current is able to flow between the source and the drain). As a result, the output of the first inverter 76 of the first inverter, comprising CMOS switches 64 66, is pulled down to the ground 70 resulting in a logical 0 at the output of the first inverter 76 as a result of the logical 1 supplied by the timing signal. Similarly, when a logical 0 is supplied by the timing signal 72, the P-type CMOS switch 64 is on and the N-type CMOS switch 66 is off. As a result, the output 76 of the first inverter, comprising CMOS switches 64 66, is pulled to the power input 74 resulting in a logical 1 at the output 76 as a result of the logical 1 supplied at the input. The second inverter, comprising the P-type CMOS switch 60 and the N-type CMOS switch 56, performs a logical inversion of the signal at the output of the first inverter 76 to generate a signal at the output to the second inverter 78 that is the inverse of the signal at the output of the first inverter 76 and that is the same as the signal provided by the timing signal 72. The first inverter and the second inverter act to buffer the signal provided by the timing signal making it difficult to determine the leakage current through the protected switch 52 by measuring the power drawn by the timing signal 72.

The protected switch 52 is an P-type CMOS switch that is driven by the output to the second inverter 78. The switch 62 is also an P-type CMOS switch that is driven directly by the timing signal 72. Hence, the protected switch 52 and the switch 62 are operated in synchronisation with one another such that, when the protected switch 52 is on, the switch 62 is also on; and when the protected switch 52 is off, the switch 64 is also off. The apparatus 50 has two modes of operation: a powered mode and an isolation mode. When in the powered mode the timing signal 72 is at a logical 0 causing the switch 62 (and, hence, the protected switch 52) to close. When the switch 62 is on (closed), the capacitor 58 is charged from the power input and the second inverter, comprising N-type CMOS switch 56 and P-type CMOS switch 60, is powered by the power input 74. As discussed, the timing signal 72 is inverted twice (once by the first inverter and once by the second inverter) and provides a logical 0 to the protected switch 52 causing the protected switch 52 to be on. As the protected switch 52 is on, current flows between the terminals (source and drain of the P-type CMOS switch 52) of the protected switch 52 and there is negligible leakage current measured at the power input. When in the isolation mode the timing signal 72 is at a logical 1 causing the switch 62 to be off (open). When the switch 62 is off, the second inverter, comprising N-type CMOS switch 56 and P-type CMOS switch 60, is powered by the capacitor 58 which discharges as the second inverter draws power. The timing signal 72 is inverted twice (once by the first inverter and once by the second invertor) to provide a logical 1 at the input to the protected switch 52 causing the protected switch 52 to be off (P-type CMOS switch 52 is off). The leakage current across the protected switch 52 cannot be detected at the power input 74 as the power input 74 is isolated from the second CMOS switches 56, 60 that form the second inverter.

In alternative configurations the protected switch 52 and the switch 62 are N-type CMOS switches that are synchronised with each other and that are on in response to a logical 1 provided by the timing signal 72. In further alternative configurations the protected switch 52 is provided by one of a P-type CMOS switch and an N-type CMOS switch, and the switch 62 is provided by the other of the P-type CMOS switch and the N-type CMOS switch, and the apparatus 50 is adapted to incorporate an odd number of levels of inversion between the signal that drives the switch 62 and the signal that drives the protected switch 52 such that the protected switch 52 is on when the switch 62 is on and the protected switch 52 is off when the switch 62 is off.

Figure 4A:
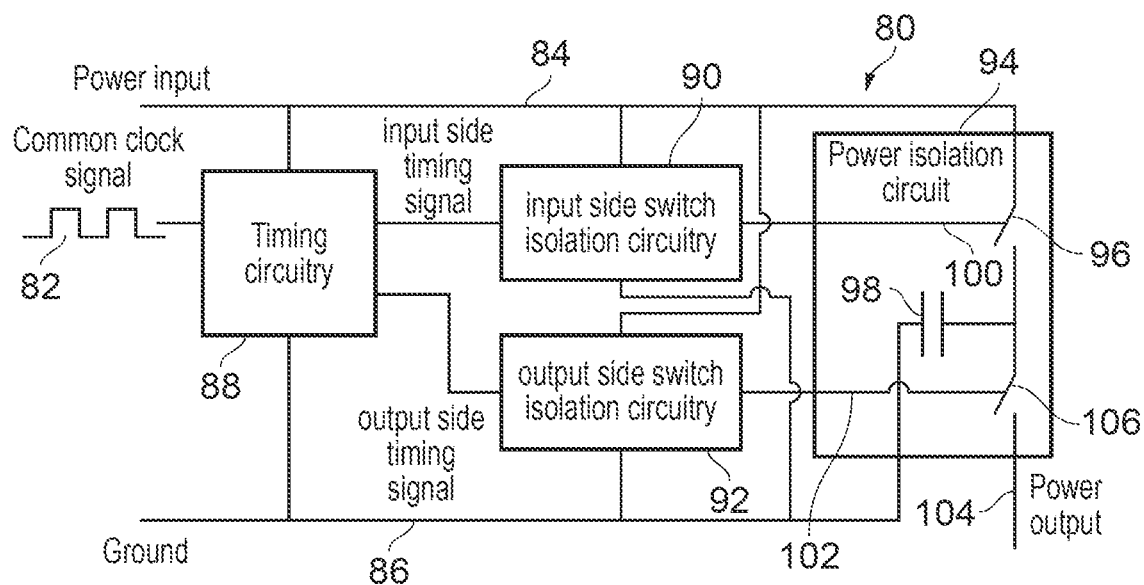
FIG. 4a schematically illustrates timing circuitry for providing power isolation between a power input and a protected switch according to various configurations of the present techniques.
Figure 4B:
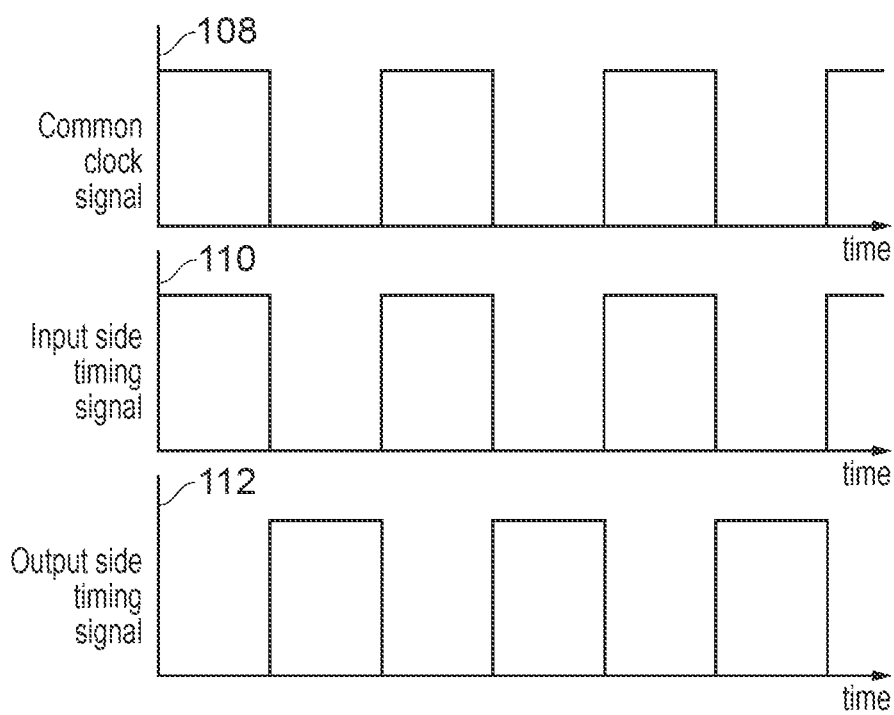
FIG. 4b schematically illustrates timing signals provided by timing circuitry according to various configurations of the present techniques.

FIGS. 4a and 4b schematically illustrate an apparatus comprising input side switch isolation circuitry 90, output side switch isolation circuitry 92, power isolation circuit 94 and timing circuitry 88 powered by power input 84 and ground 86. The power isolation circuit 94 is arranged to provide power at a power output 104 which is used, in combination with the ground 86, to provide power to protected circuitry. The power isolation circuit 94 comprises an input side protected switch 96 controlled by input side buffered signal 100 that is generated by the input side switch isolation circuitry 90 and an output protected switch 106 that is controlled by an output side buffered signal 102 that is generated by the output side switch isolation circuitry 92. The power isolation circuit 94 is also provided with a capacitor (charge store) 98 to provide power to the power output 104 when the input side protected switch 96 is open and the power output 104 is isolated from the power input 84. The input side switch isolation circuitry 90 and the output side switch isolation circuitry 92 are each arranged as described in relation to FIGS. 1-3 and are powered by input side timing signal and the output side timing signal that are generated by the timing circuitry 88 in response to a common clock signal 82. The relative timing of the common clock signal 82 to the input side timing signal and the output side timing signal is schematically illustrated in FIG. 4b. Graph 108 schematically illustrates the common clock signal 82, graph 110 schematically illustrates the input side timing signal, and graph 112 schematically illustrates the output side timing signal. The input side timing signal 110 and the output side timing signal 112 are non-overlapping signals such that at most one of the input side timing signal and the output side timing signal are at a logical 1 at any time.

The apparatus 80 operates to ensure that the power output 104 is isolated from the power input 84 by the power isolation circuit 94 with the input side switch isolation circuitry 90 and the output side switch isolation circuitry 92 provided to prevent leakage current from the input side protected switch 96 and the output side protected switch 106 from being measurable at the power input 84 and/or at the common clock signal 82. The input side buffered signal 100 is synchronised to the input side timing signal (illustrated in graph 110). The output side buffered signal 102 is synchronised to the output side timing signal (illustrated in graph 112). Hence, at most one of the input side buffered signal 100 and the output side buffered signal 102 are at a logical 1 at any time. As a result, only one of the input side protected switch 96 and the output side protected switch 106 are closed at any one time.

When the input side timing signal is high (logical 1) the input side buffered signal 100 is also high and the input side protected switch 96 is closed. At the same time, the output side timing signal is low resulting in the output side buffered signal 102 being low (logical 0). As a result, the output side protected switch 106 is open and the power output 104 is isolated from the power input 84. Whilst the input side protected switch 96 is closed, the capacitor 98 is connected to the power input 84 and is able to charge. Protected circuitry that may be connected between the power output 104 and the ground signal 86 may receive power via an additional capacitor (not illustrated) or from an alternative apparatus connected in parallel to the apparatus 80.

When the output side timing signal is high (logical 1) the output side buffered signal 102 is also high and the output side protected switch 106 is closed. At the same time, the input side timing signal is low resulting in the input side buffered signal 100 being low (logical 0). As a result, the input side protected switch 96 is open and the power output 104 is isolated from the power input 84. Whilst the output side protected switch 106 is closed, the capacitor 98 is connected to the power output 104 and discharges as the power output 104 draws charge from the capacitor 98. Protected circuitry that may be connected between the power output 104 and the ground signal 86 therefore receives power from the capacitor 98.

In alternative configurations the input side protected switch 96 is provided as a switch which is closed in response to the input side buffered signal 100 being low (logical 0) and which is open in response to the input side buffered signal 100 being high (logical 1). In further alternative configurations the output side protected switch 106 is provided as a switch which is closed in response to the output side buffered signal 102 being low (logical 0) and which is open in response to the output side buffered signal 102 being high (logical 1). It would be appreciated by the skilled person that, the requirement for power isolation is that only one of the input side protected switch 96 and the output side protected switch 106 is closed at any one time and that this can be achieved through different combinations of switch types and timing signals.

Figure 5A:
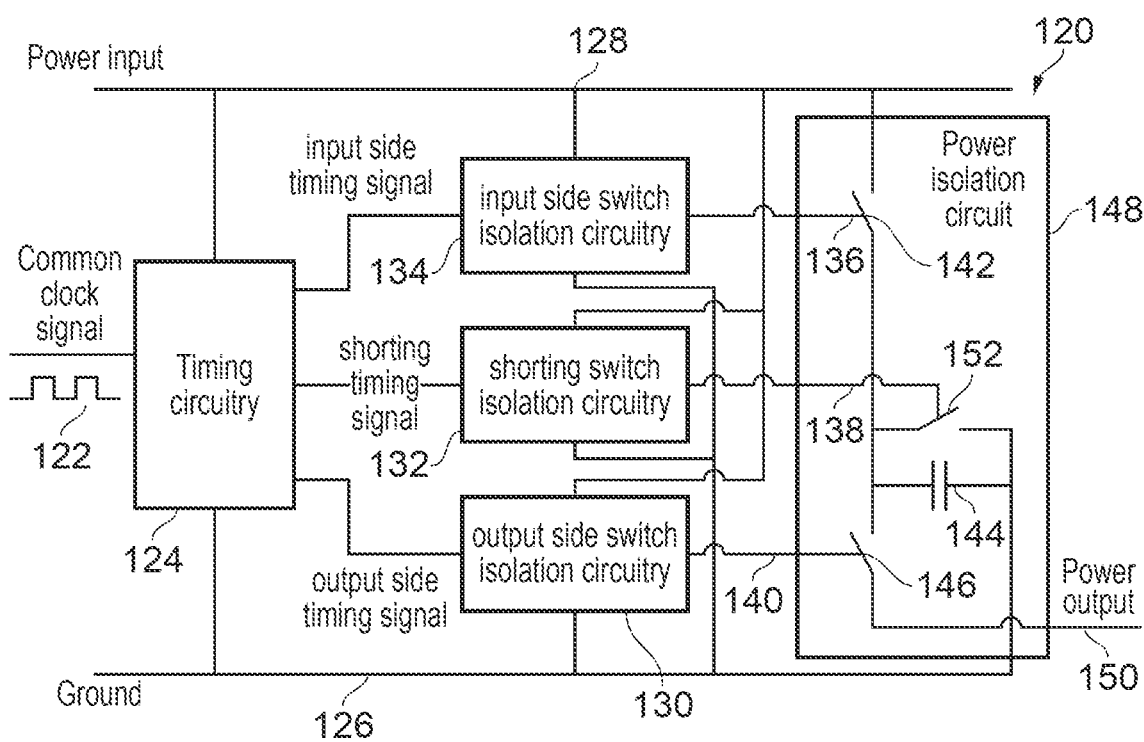
FIG. 5a schematically illustrates timing circuitry for providing power isolation between a power input and a protected switch according to various configurations of the present techniques.
Figure 5B:
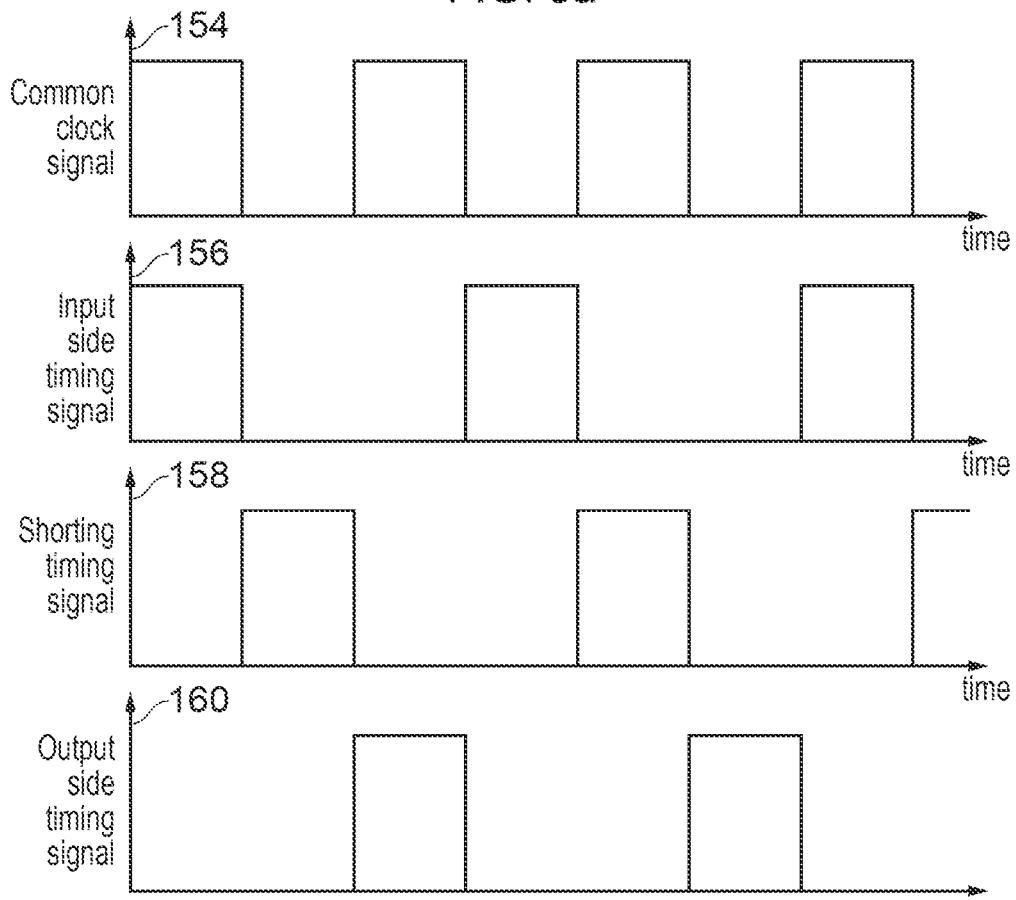
FIG. 5b schematically illustrates timing signals provided by timing circuitry according to various configurations of the present techniques.

FIGS. 5*a* and 5*b* schematically illustrate an apparatus comprising input side switch isolation circuitry 134, output side switch isolation circuitry 130, shorting switch isolation circuitry 132, power isolation circuit 148 and timing circuitry 124 powered by power input 128 and ground 126. The power isolation circuit 148 is arranged to provide power at a power output 150 which is used, in combination with the ground 126, to provide power to protected circuitry. The power isolation circuit 148 comprises an input side protected switch 142 controlled by input side buffered signal 136 that is generated by the input side switch isolation circuitry 134, a shorting protected switch 152 controlled by shorting buffered signal 138 that is generated by the shorting switch isolation circuitry 132, and an output protected switch 146 that is controlled by an output side buffered signal 140 that is generated by the output side switch isolation circuitry 130. The power isolation circuit 148 is also provided with a capacitor (charge store) 144 to provide power to the power output 150 when the input side protected switch 142 is open, the output side protected switch 146 is closed, and the power output 150 is isolated from the power input 128. The input side switch isolation circuitry 134, the shorting switch isolation circuitry 132 and the output side switch isolation circuitry 130 are each arranged as described in relation to FIGS. 1-3 and are powered by the input side timing signal, the shorting timing signal, and the output side timing signal that are generated by the timing circuitry 124 in response to a common clock signal 122. The relative timing of the common clock signal 122 to the input side timing signal, the shorting timing signal, and the output side timing signal is schematically illustrated in FIG. 5*b*. Graph 154 schematically illustrates the common clock signal 122, graph 156 schematically illustrates the input side timing signal, graph 158 schematically illustrates the shorting timing signal, and graph 160 schematically illustrates the output side timing signal. The input side timing signal 156, the shorting timing signal 158, and the output side timing signal 160 are non-overlapping signals such that at most one of the input side timing signal, the shorting timing signal, and the output side timing signal are at a logical 1 at any time.

The apparatus 120 operates to ensure that the power output 150 is isolated from the power input 128 by the power isolation circuit 148 with the input side switch isolation circuitry 134, the shorting switch isolation circuitry 132, and the output side switch isolation circuitry 130 provided to prevent leakage current from the input side protected switch 142, the shorting protected switch 152 and the output side protected switch 146 from being measurable at the power input 128 and/or at the common clock signal 122. The input side buffered signal 136 is synchronised to the input side timing signal (illustrated in graph 156). The shorting buffered signal 138 is synchronised to the shorting timing signal (illustrated in graph 158). The output side buffered signal 140 is synchronised to the output side timing signal (illustrated in graph 160). Hence, at most one of the input side buffered signal 136, the shorting buffered signal 138, and the output side buffered signal 140 are at a logical 1 at any time. As a result, only one of the input side protected switch 142, the shorting protected switch 152, and the output side protected switch 146 are closed at any one time.

When the input side timing signal is high (logical 1) the input side buffered signal 136 is also high and the input side protected switch 142 is closed. At the same time, the shorting timing signal and the output side timing signal are low resulting in the shorting buffered signal 138 and the output side buffered signal 140 being low (logical 0). As a result, the shorting protected switch 152 and the output side protected switch 146 are open and the power output 150 is isolated from the power input 128. Whilst the input side protected switch 142 is closed, the capacitor 144 is connected to the power input 128 and is able to charge. Protected circuitry that may be connected between the power output 150 and the ground signal 126 may receive power via an additional capacitor (not illustrated) or from an alternative apparatus connected in parallel to the apparatus 120.

When the shorting timing signal is high (logical 1) the shorting buffered signal 138 is also high and the shorting protected switch 152 is closed. At the same time, the input side timing signal and the output side timing signal are low resulting in the input side buffered signal 136 and the output side buffered signal 140 being low (logical 0). As a result, the input side protected switch 142 and the output side protected switch 146 are open and the power output 150 is isolated from the power input 128. Whilst the shorting protected switch 152 is closed the capacitor 144 is discharged through the shorting protected switch 152 to refresh the charges stored in the capacitor 144. Protected circuitry that may be connected between the power output 150 and the ground signal 126 may receive power via an additional capacitor (not illustrated) or from an alternative apparatus connected in parallel to the apparatus 120.

When the output side timing signal is high (logical 1) the output side buffered signal 140 is also high and the output side protected switch 146 is closed. At the same time, the input side timing signal and the shorting timing signal are low resulting in the input side buffered signal 136 and the shorting buffered signal 138 being low (logical 0). As a result, the input side protected switch 142 and the shorting protected switch 152 are open and the power output 150 is isolated from the power input 128. Whilst the output side protected switch 146 is closed, the capacitor 144 is connected to the power output 150 and discharges as the power output 150 draws charge from the capacitor 144. Protected circuitry that may be connected between the power output 150 and the ground signal 126 therefore receives power from the capacitor 144.

In alternative configurations the input side protected switch 142 is provided as a switch which is closed in response to the input side buffered signal 136 being low (logical 0) and which is open in response to the input side buffered signal 136 being high (logical 1). In other alternative configurations the shorting protected switch 152 is provided as a switch which is closed in response to the shorting buffered signal 138 being low (logical 0) and which is open in response to the shorting buffered signal 138 being high (logical 1). In further alternative configurations the output side protected switch 146 is provided as a switch which is closed in response to the output side buffered signal 140 being low (logical 0) and which is open in response to the output side buffered signal 140 being high (logical 1). It would be appreciated by the skilled person that, the requirement for power isolation is that only one of the input side protected switch 142, the shorting protected switch 152, and the output side protected switch 146 is closed at any one time and that this can be achieved through different combinations of switch types and timing signals.

Figure 6:
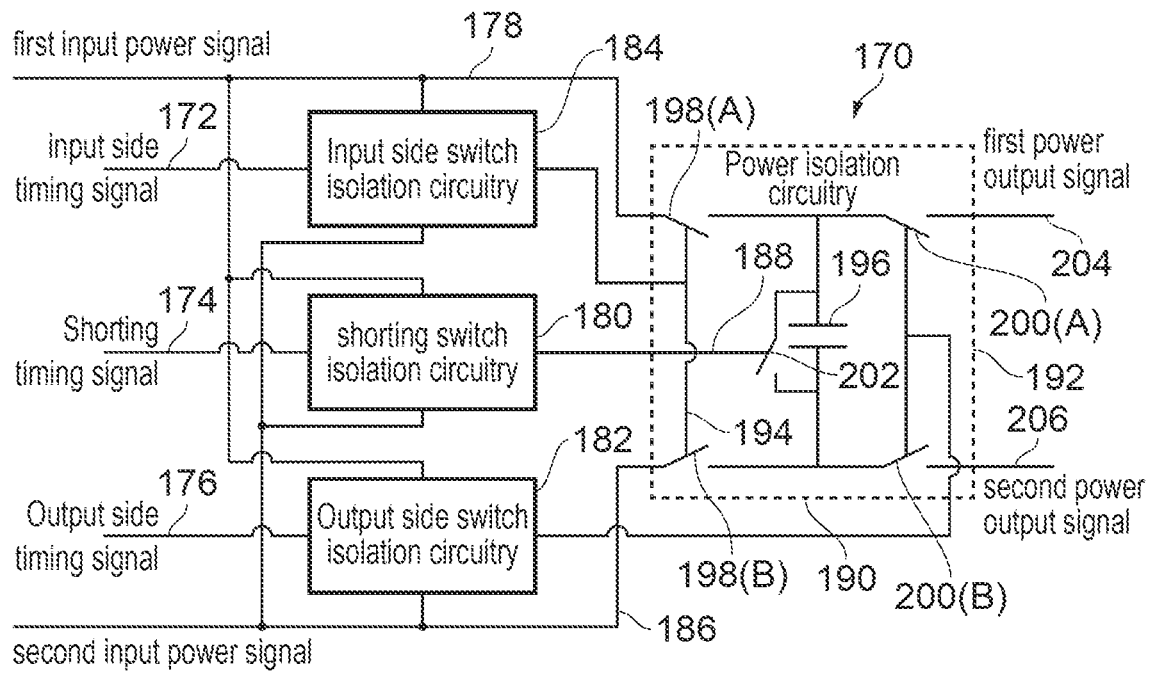
FIG. 6 schematically illustrates power isolation circuitry according to various configurations of the present techniques.

FIG. 6 schematically illustrates an alternative configuration in which the power isolation circuitry 192 is provided with first input side protected switch 198(A) and first output side power isolation switch 200(A) between the first power input signal 178 and the first power output signal 204, and with second input side protected switch 198(B) and second output side power isolation switch 200(B) between the second power input signal 186 and the second power output signal 206. The power isolation circuitry 192 operates to provide electrical isolation between the first input power signal 178 and the first power output signal 204; and between the second input power signal 186 and the second power output signal 206. The first input side power isolation switch 198(A) and the second input side power isolation switch 198(B) are synchronised with one another such that the first input side power isolation switch 198(A) and the second input side power isolation switch 198(B) are open at a same time, and the first input side power isolation switch 198(A) and the second input side power isolation switch 198(B) are closed at a same time. The first input side power isolation switch 198(A) and the second input side power isolation switch 198(B) are controlled by the input side buffered signal 194 which is controlled by the input side switch isolation circuitry 184 in synchronisation with the input side timing signal 172. The first output side power isolation switch 200(A) and the second output side power isolation switch 200(B) are synchronised with one another such that the first output side power isolation switch 200(A) and the second output side power isolation switch 200(B) are open at a same time, and the first output side power isolation switch 200(A) and the second output side power isolation switch 200(B) are closed at a same time. The first output side power isolation switch 200(A) and the second output side power isolation switch 200(B) are controlled by the output side buffered signal 190 which is controlled by the output side switch isolation circuitry 184 in synchronisation with the output side timing signal 176. The power isolation circuitry is also provided with a capacitor 196 (charge store) and shorting protected switch 202 that is controlled by the shorting buffered signal 188 that is generated by the shorting switch isolation circuitry 180 in synchronisation with the shorting timing signal 174. The input side timing signal 172, the shorting timing signal 174, and the output side timing signal 176 are non-overlapping timing signals that may be generated based on a common clock signal, for example, as illustrated in FIG. 4b.

When the input side timing signal 172 is high (logical 1) the input side buffered signal 194 is also high and the input side protected switches 198(A) and 198(B) are closed. At the same time, the shorting timing signal 174 and the output side timing signal 176 are low resulting in the shorting buffered signal 188 and the output side buffered signal 190 being low (logical 0). As a result, the shorting protected switch 202 and the output side protected switches 200(A) and 200(B) are open and the first power output signal 204 and the second power output signal are isolated from the first power input signal 178 and the second power input signal 186. Whilst the input side protected switches 198(A) and 198(B) are closed, the capacitor 196 is connected to the first power input signal 178 by the first input side protected switch 198(A) and is connected to the second power input signal 186 by the second input side protected switch 198(B). As a result, the capacitor 196 is able to charge from the first power input signal 178 and the second power input signal 186. Protected circuitry that may be connected between the first power output signal 204 and the second power output signal 206 may receive power via an additional capacitor (not illustrated) or from an alternative apparatus connected in parallel to the apparatus 170.

When the shorting timing signal 174 is high (logical 1) the shorting buffered signal 188 is also high and the shorting protected switch 202 is closed. At the same time, the input side timing signal 172 and the output side timing signal 176 are low resulting in the input side buffered signal 194 and the output side buffered signal 190 being low (logical 0). As a result the input side protected switches 198(A) and 198(B), and the output side protected switches 200(A) and 200(B) are open and the first power output signal 204 is isolated from the first input power signal 178, and the second power output signal is isolated from the second input power signal 186. Whilst the shorting protected switch 202 is closed the capacitor 196 is discharged through the shorting protected switch 202 to refresh the charges stored in the capacitor 196. Protected circuitry that may be connected between the first power output signal 204 and the second power output signal 206 may receive power via an additional capacitor (not illustrated) or from an alternative apparatus connected in parallel to the apparatus 170.

When the output side timing signal 176 is high (logical 1) the output side buffered signal 190 is also high and the output side protected switches 200(A) and 200(B) are closed. At the same time, the input side timing signal 172 and the shorting timing signal 174 are low resulting in the input side buffered signal 194 and the shorting buffered signal 188 being low (logical 0). As a result, the input side protected switches 198(A) and 198(B), and the shorting protected switch 202 are open and the first power output signal 204 is isolated from the first input power signal 178, and the second power output signal is isolated from the second input power signal 186. Whilst the output side protected switches 200(A) and 200(B) are closed, the capacitor 196 is connected to the first power output signal 204 and the second power output signal 206 and the capacitor 196 discharges as power is drawn between the first power output signal 204 and the second power output signal 206. Protected circuitry that may be connected between the first power output signal 204 and the second power output signal 206 therefore receives power from the capacitor 196.

The first input side isolation switch 198(A) and the second input side isolation switch 198(B), the first output side isolation switch 200(A) and the second output side isolation switch 200(B), and the shorting isolation switch 202 are illustrated schematically and can be provided by any electronic component that provides the appropriate switching operation with the first input side isolation switch 198(A) synchronised with the second input side isolation switch 198(B), and with the first output side isolation switch 200(A) synchronised with the second input side isolation switch 200(B). In alternative configurations the first input side protected switch, the second input side protected switch, the shorting protected switch, the first output side protected switch and the second output side protected switch are provided as switches that close in response to the corresponding buffered signal (input side buffered signal 136, shorting buffered signal 138, and output side buffered signal 140) being low. In such configurations either an additional level of inversion can be applied in the input side switch isolation circuitry 134, the shorting switch isolation circuitry 132 and the output side switch isolation circuitry 130 respectively; or the timing circuitry 124 can be modified such that the input side timing signal, the shorting timing signal and the output side timing signal are provided such that only one such signal is low at a given time.

Figure 7:
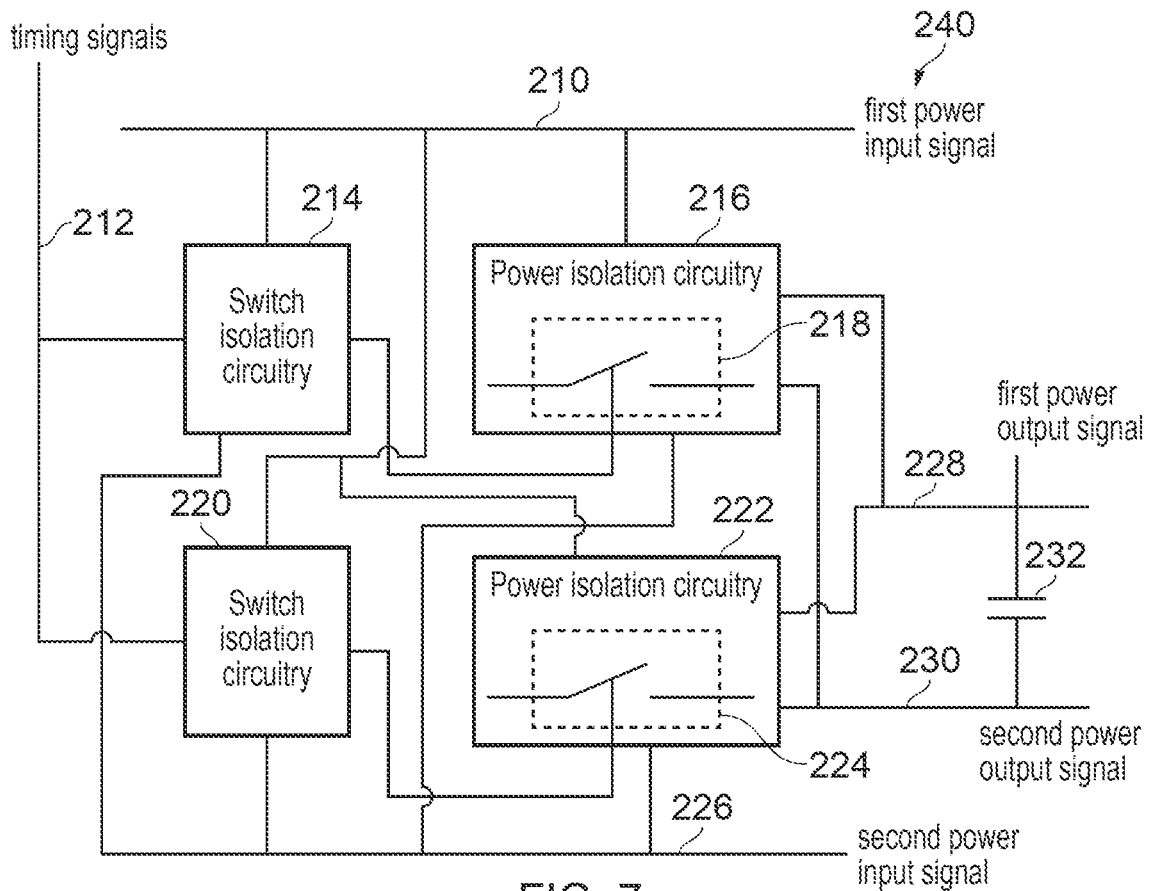
FIG. 7 schematically illustrates an apparatus comprising a plurality of power isolation circuits according to various configurations of the present techniques.

FIG. 7 schematically illustrates an apparatus 240 according to various configurations of the present techniques. The apparatus 240 is provided with a plurality of power isolation circuits including power isolation circuitry 216 which comprises protected switch 218 and power isolation circuitry 222 which comprises protected switch 224. The power isolation circuitry 216 and the power isolation circuitry 222 are powered by the first input power signal 210 and the second input power signal 226. The protected switch in 218 in the power isolation circuitry 216 is controlled by a buffered signal from the switch isolation circuitry 214 and the protected switch 224 is controlled by a buffered signal from the switch isolation circuitry 220. Each of the switch isolation circuitry 214 and the switch isolation circuitry 220 is powered by the first input power signal 210 and the second input power signal 226. The switch isolation circuitry 214 and the switch isolation circuitry 220 generate the respective buffered signals in synchronisation with the timing signals 212. The power isolation circuitry 216 and the power isolation circuitry 222 are arranged such that one of the power isolation circuitry 216 and the power isolation circuitry 22 is providing power to the first power output signal 228 and the second power output signal 230 at any given time. Furthermore, a capacitor 232 (charge store) is provided between the first power output signal and the second power output signal to provide power to protected circuitry that is connected to the first power output signal 228 and the second power output signal 230. The power isolation circuitry 216 and the power isolation circuitry 222 are each configured to isolated the first power input signal 210 and the second power input signal 226 from the first output power signal 228 and the second power output signal 230 according to the techniques described in relation to FIGS. 1 to 6. The switch isolation circuitry 214 and the switch isolation circuitry 220 are arranged to isolate the control signals for the protected switch 218 and the protected switch 224 from the first power input signal 210 and the timing signals 212 respectively. In alternative configurations the plurality of power isolation circuits could comprise more than two power isolation circuits, each with a corresponding switch isolation circuit.

Figure 8:
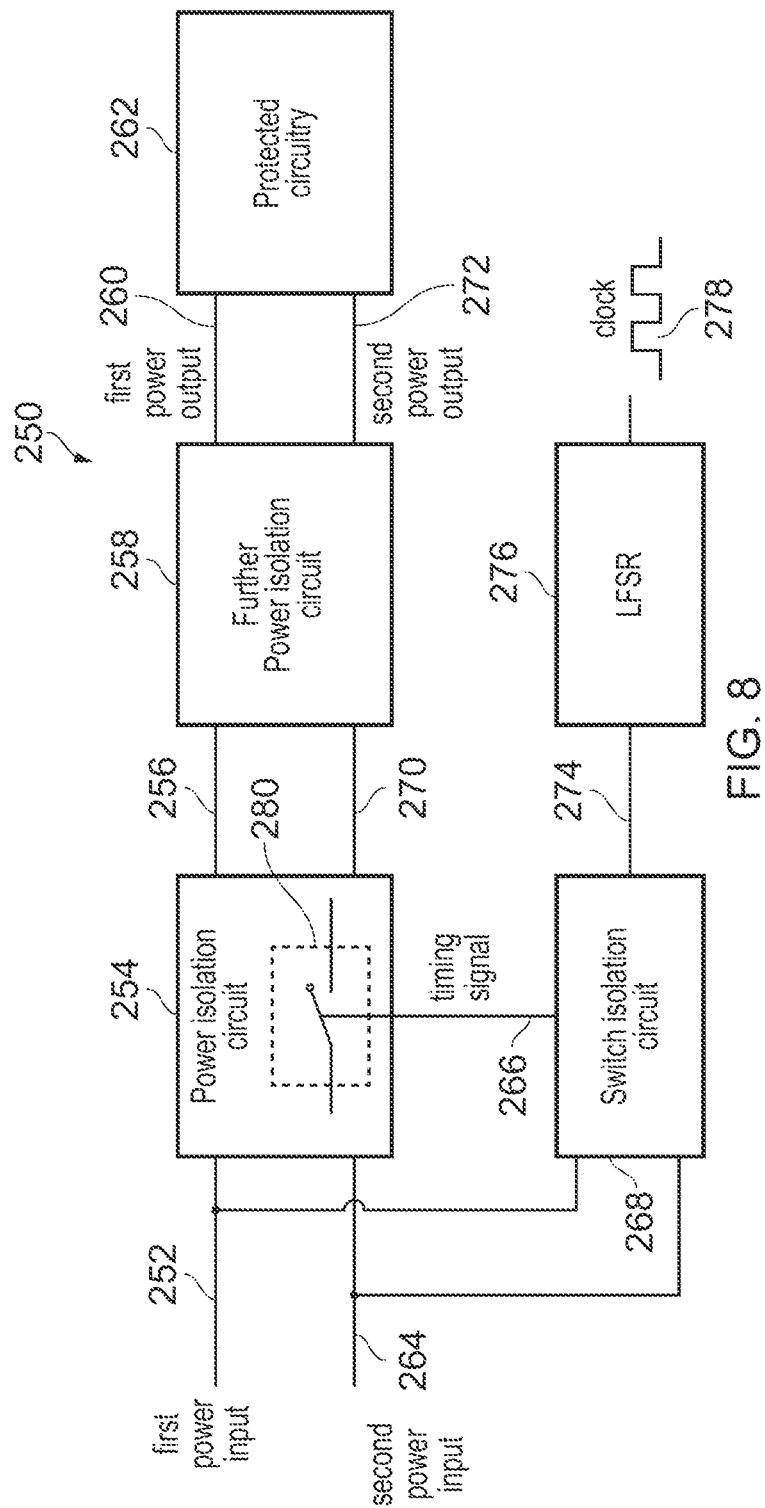
FIG. 8 schematically illustrates power isolation circuitry according to various configurations of the present techniques.

FIG. 8 schematically illustrates an apparatus 250 in accordance with various configurations of the present techniques. The apparatus 250 comprises power isolation circuitry 254, which includes protected switch 280, further power isolation circuitry 258, protected circuitry 262, switch isolation circuitry 268 and Linear Feedback Shift Register (LFSR) 276. The power isolation circuit 254 is connected to first power input 252 and second power input 264. Based on the timing signal 266, generated by the switch isolation circuit 268, the power isolation circuit 254 generates intermediate signal 256 and intermediate signal 270 which are fed into the further power isolation circuitry 258. In the illustrated configuration the power isolation circuit 254 is a switch capacitor filter as described hereinabove and provides isolation of the first power input 252 and the second power input 264 from the intermediate power signal 256 and the intermediate power signal 270. In particular, the power isolation circuit 254 acts to filter low frequency variations in the power consumption of the protected circuitry 262 from being detected at the first power input 252 and/or the second power input 264. Furthermore, the protected switches 280 that control the operation of the power isolation circuit 254 are controlled by timing signals 266 that are generated by the switch isolation circuitry 268 which acts to isolate the timing signals 266 from the first power input 252 and/or the second power input 264 as described herein above. The switch isolation circuit 268 is controlled by the common clock signal 274 that is provided by LFSR 276. The LFSR 276 is a shift register that is driven by clock signal 278 operating at the maximum switching frequency of the protected switch 280. The input bit of the shift register is driven using a logical function of a set of bits of the overall shift register value and generates a stream of values in a repeating cycle, thereby generating the common timing signal 274 as a clock signal with a varying frequency. The further power isolation circuit 258 is configured to output a first power output 260 and a second power output 272 such that a difference in the voltage (the potential difference) between the first power output 260 and the second power output 272 is lower than a difference in voltage between the intermediate voltage signal 256 and the intermediate voltage signal 270. The difference in voltage that is output between the first power output 260 and the second power output 272 is dependent on a frequency of switching of the protected switch 280 in the power isolation circuit 254. Furthermore, the further power isolation circuit 258 acts to filter high frequency variations in the power consumption of the protected circuitry 262 from being detected at the first power input 252 and/or at the second power input 264.

Figure 9:
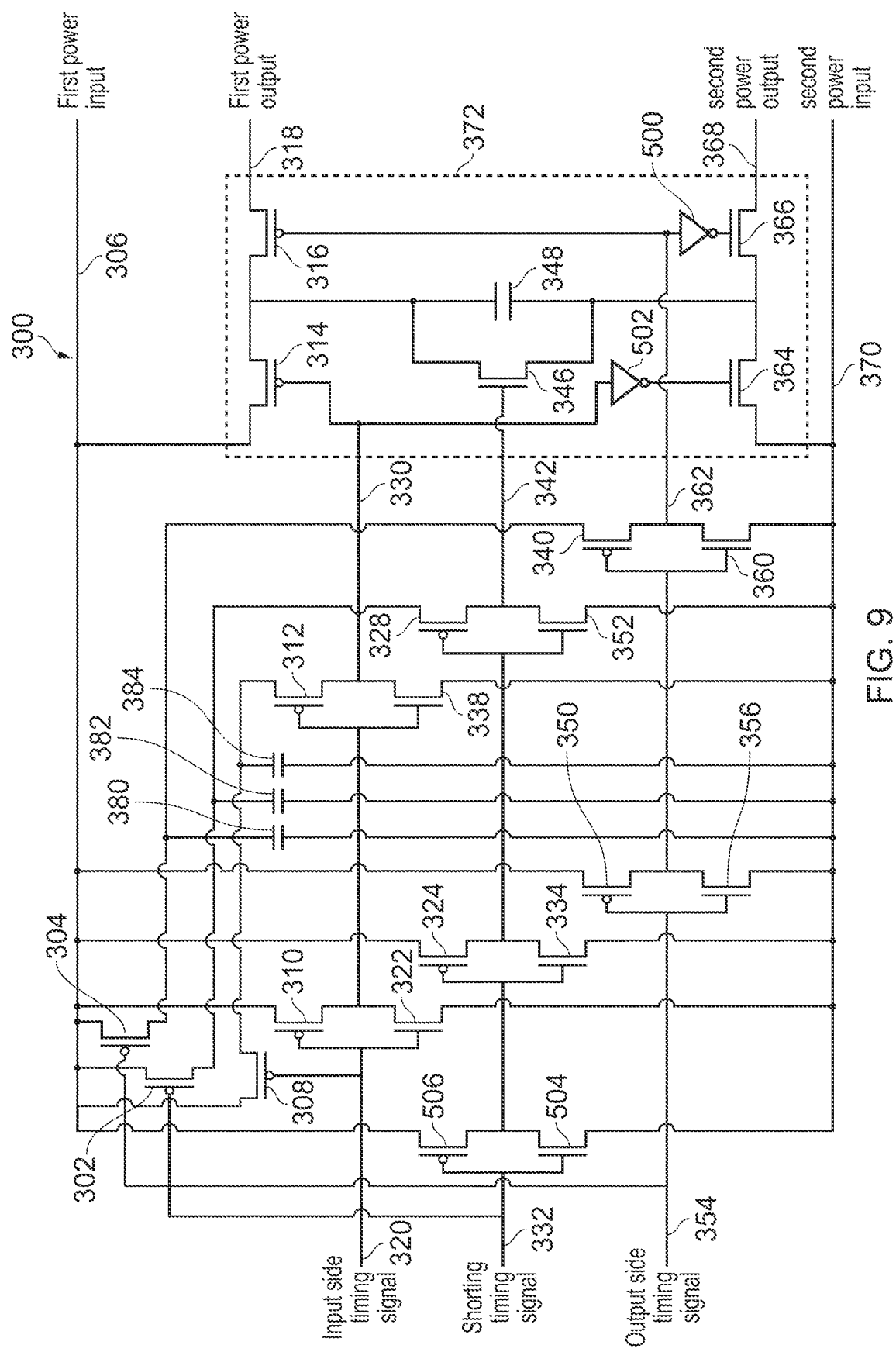
FIG. 9 schematically illustrates details of an apparatus for providing power isolation between power input and protected switches of a power isolation circuit according to various configurations of the present techniques.

FIG. 9 schematically illustrates a circuit diagram of an apparatus 300 according to various configurations of the present techniques. The apparatus 300 comprises power isolation circuitry 372 that isolates the first power input 306 and the second power input 370 from the first power output 318 and the second power output 368. The power isolation circuitry 372 comprises a number of protected switches including first input side protected switch 314, second input side protected switch 364, first output side protected switch 316, second output side protected switch 366, and shorting protected switch 346. The power isolation circuitry 372 is also provided with a capacitor 348 (power isolation charge store) that operates to provide a potential difference between the first power output 318 and the second power output 368 when the first output side protected switch 216 and the second output side protected switch 366 are closed, and the first input side protected switch 314, the second input side protected switch 364, and the shorting protected switch 346 are each open. The shorting protected switch 346 is connected in parallel with the capacitor 348 such that, when the shorting switch 346 is closed, the capacitor 348 is discharged through the shorting protected switch 346.

The first input side protected switch 314 and the second input side protected switch 364 are controlled by the input side buffered signal 330, the first output side protected switch 316 and the second output side protected switch 366 are controlled by the output side buffered signal 362, and the shorting protected switch is controlled by the shorting buffered signal 342. The input side buffered signal 330 is synchronised to the input side timing signal 320 via the first input side inverter (P-type CMOS switch 310 and N-type CMOS switch 322), and the second input side inverter (P-type CMOS switch 312 and N-type CMOS switch 338). The second input side inverter is arranged such that P-type CMOS switch 312 and N-type CMOS switch 338 receive power from the second power input 370 and one of the capacitor 384 and the first power input 306 dependent on whether the input side timing signal 320 is high (logical 1) or low (logical 0). When the input side timing signal is low, the switch 308 is closed and power is able to flow from the first power input 306 to the capacitor 384 and to the second input side inverter. When the input side timing signal 320 is high, the switch 308 is open and power cannot flow from the first power input to the capacitor 384 or to the second input side inverter. Hence, when the input side timing signal 320 is high the second input side inverter is powered by the charge stored in the capacitor 384. As discussed, the input side buffered signal 330 is synchronised to the input side timing signal 320 and is therefore high when the input side timing signal 320 is high and is low when the input side timing signal 320 is low. The first input side protected switch 314 is provided as a P-type CMOS switch, i.e., the same type of CMOS switch as the switch 308. The second input side protected switch 364 is provided as an N-type CMOS switch for which an inverter 502 is provided between the input side buffered signal 330 and the gate of the second input side protected switch 364. As a result, the first input side protected switch 314 and the second input side protected switch 364 are closed when the switch 308 is closed and are open when the switch 308 is open. Hence, when the first input side protected switch is open and the second input side protected switch is open, the input side buffered signal is isolated from the first power input 306 and any leakage current through the first input side protected switch 314 and the second input side protected switch 364 cannot be detected at the first power input 306.

The shorting buffered signal 342 is synchronised to the inverse of the shorting timing signal 332 via the first shorting inverter (P-type CMOS switch 506 and N-type CMOS switch 504), the second shorting inverter (P-type CMOS switch 324 and N-type CMOS switch 334), and the third shorting inverter (P-type CMOS switch 328 and N-type CMOS switch 352). The third shorting inverter is arranged such that P-type CMOS switch 328 and N-type CMOS switch 352 receive power from the second power input 370 and one of the capacitor 382 and the first power input 306 dependent on whether the shorting timing signal 332 is high (logical 1) or low (logical 0). When the shorting timing signal 332 is low, the switch 302 is closed and power is able to flow from the first power input 306 to the capacitor 382 and to the third shorting inverter. When the shorting timing signal 332 is high, the switch 302 is open and power cannot flow from the first power input 306 to the capacitor 382 or to the third shorting inverter. Hence, when the shorting timing signal 332 is high the third shorting inverter is powered by the charge stored in the capacitor 382. As discussed, the shorting buffered signal 342 is synchronised to the inverse of the shorting timing signal 332 and is therefore high when the shorting timing signal 332 is low and is low when the shorting timing signal 332 is high. As a result, the shorting protected switch 346 (which is an N-type CMOS switch) is closed when the switch 302 is closed and is open when the switch 302 is open. Hence, when the shorting protected switch is open, the shorting buffered signal 342 is isolated from the first power input 306 and any leakage current through the shorting protected switch cannot be detected at the first power input 306. In an alternative configuration, the first and second inverter are removed so that there is only the third inverter between the shorting timing signal 332 and the shorting buffered signal 342. In a further alternative, any number of pairs of inverters can be provided between the shorting timing signal 332 and the shorting buffered signal 342 so long as the shorting protected switch 346 is synchronised with the switch 302 by providing a shorting buffered signal 342 that is synchronised to the inverse of the shorting timing signal 332.

The output side buffered signal 362 is synchronised to the output side timing signal 354 via the first output side inverter (P-type CMOS switch 350 and N-type CMOS switch 356), and the second input side inverter (P-type CMOS switch 340 and N-type CMOS switch 360). The second output side inverter is arranged such that P-type CMOS switch 340 and N-type CMOS switch 360 receive power from the second power input 370 and one of the capacitor 380 and the first power input 306 dependent on whether the output side timing signal 354 is high (logical 1) or low (logical 0). When the output side timing signal 354 is low, the switch 304 is closed and power is able to flow from the first power input 306 to the capacitor 380 and to the second output side inverter. When the output side timing signal 354 is high, the switch 304 is open and power cannot flow from the first power input 306 to the capacitor 380 or to the second output side inverter. Hence, when the output side timing signal 354 is high the second output side inverter is powered by the charge stored in the capacitor 380. As discussed, the output side buffered signal 362 is synchronised to the output side timing signal 354 and is therefore high when the output side timing signal 354 is high and is low when the output side timing signal 354 is low. The first output side protected switch 316 is provided as a P-type CMOS switch, i.e., the same type of CMOS switch as the switch 304. The second output side protected switch 366 is provided as an N-type CMOS switch for which an inverter 500 is provided between the output side buffered signal 362 and the gate of the second input side protected switch 366. As a result, the first output side protected switch 316 and the second output side protected switch 366 are closed when the switch 304 is closed and are open when the switch 304 is open. Hence, when the first output side protected switch is open and the second output side protected switch is open, the output side buffered signal 362 is isolated from the first power input 306 and any leakage current through the first output side protected switch 316 and the second output side protected switch 366 cannot be detected at the first power input 306.

The input side timing signal 320, the output side timing signal 354, and the shorting timing signal 332 are configured such that only one of the input side timing signal 320, the shorting timing signal 332 and the output side timing signal 354 are low at any given time. As a result, only one of the input side buffered signal 330, the shorting buffered signal 342 and the output side buffered signal 362 is low at any point. Therefore, only one set of switches within the power isolation circuit 372 are closed at any time. In particular, when the first input side protected switch 314 and the second input protected switch 364 are closed, each of the shorting protected switch 348, the first output side protected switch 316 and the second output side protected switch 366 are open. When the shorting protected switch 346 is closed, each of the first input side protected switch 314, the second input side protected switch 364, the first output side protected switch 316 and the second output side protected switch 366 are open. When the first output side protected switch 316 and the second output side protected switch 366 are closed, each of the first input side protected switch 314, the second input side protected switch 346 and the second input side protected switch 364 are open. This configuration therefore acts to isolated the first power input 306 and the second power input 370 from the first power output 318 and the second power output 368. It would be readily apparent to the person skilled in the art that the N-type and P-type CMOS switches depicted in FIG. 9 could be replaced with P-type or N-type CMOS switches respectively so long as the described synchronisation is present.

Figure 10:
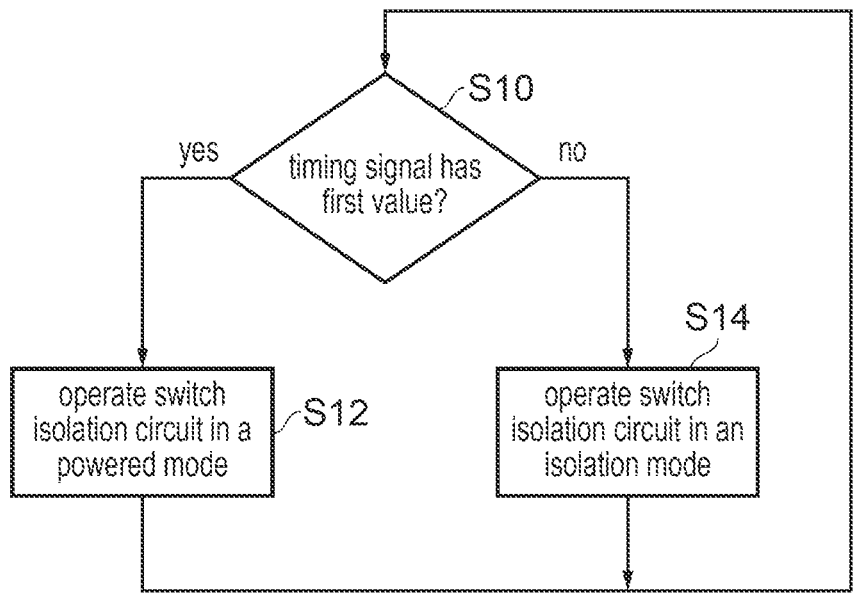
FIG. 10 schematically illustrates a sequence of steps for operation of power isolation circuitry according to various configurations of the present techniques.

FIG. 10 schematically illustrates the switch of a mode of the switch isolation circuit in response to a timing signal. At step S10 it is determined whether the timing signal has a first value. If, at step S10, it is determined that the timing signal has the first value then flow proceeds to step S12 where the switch isolation circuit is operated in a powered mode in which the switch isolation charge store is configured to receive power from the power input. Flow then returns to step S10. If, at step S10, it was determined that the timing signal does not have the first value then flow proceeds to step S14 where the switch isolation circuit is operated in an isolation mode in which the switch isolation charge store is isolated from the power input. Flow then returns to step S10.

Figure 11:
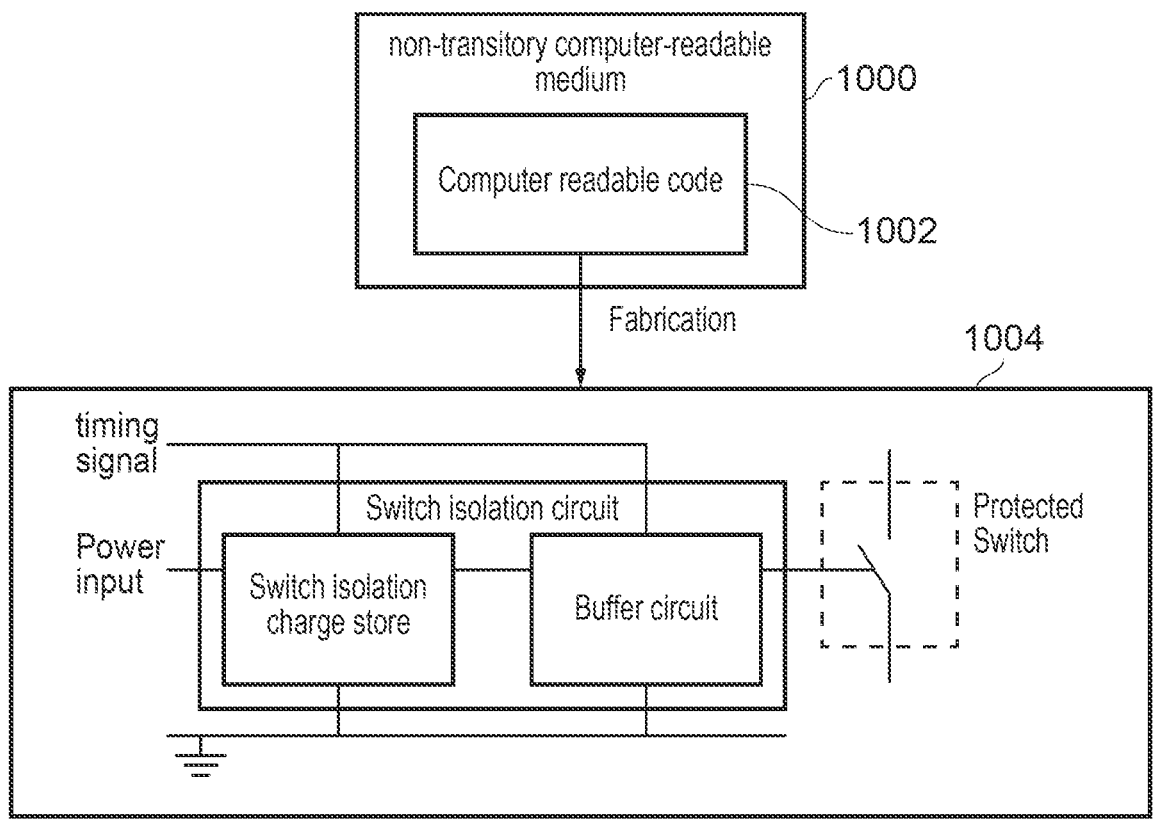
FIG. 11 schematically illustrates the use of a non-transitory computer-readable medium for fabrication of an apparatus according to various configurations of the present techniques.

FIG. 11 schematically illustrates the fabrication of an apparatus 1004 according to various configurations of the present techniques. Fabrication is carried out based on computer readable code 1002 that is stored on a non-transitory computer-readable medium 1000. The computer-readable code can be used at one or more stages of a semiconductor design and fabrication process, including an electronic design automation (EDA) stage, to fabricate an integrated circuit comprising the apparatus embodying the concepts. The fabrication process involves the application of the computer readable code 1002 either directly into one or more programmable hardware units such as a field programmable gate array (FPGA) to configure the FPGA to embody the configurations described hereinabove or to facilitate the fabrication of an apparatus implemented as one or more integrated circuits or otherwise that embody the configurations described hereinabove. The fabricated design 1004 comprises the apparatus 10 described in relation to FIG. 1. However, in alternative configurations the fabricated design can be produced according to any of the configurations described hereinabove and can be fabricated as the whole of or as part an integrated circuit.

In brief overall summary there is provided an apparatus and method, the apparatus comprising a power input and a switch isolation circuit to provide isolation between the power input and a protected switch responsive to a timing signal. The switch isolation circuit comprises a switch isolation charge store, and a buffer circuit to receive power from the switch isolation charge store and coupled between the timing signal and the protected switch. The switch isolation circuit is configured to, in response to the timing signal having the first value, operate in a powered mode in which the switch isolation charge store receives power from the power input; and, in response to the timing signal having the second value, operate in an isolation mode in which the switch isolation charge store is isolated from the power input.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope of the invention as defined by the appended claims. For example, various combinations of the features of the dependent claims could be made with the features of the independent claims without departing from the scope of the present invention.

We claim:
1. An apparatus comprising:
a power input;
a power output;
a switch isolation circuit to provide isolation between the power input and a protected switch configured to close in response to a timing signal having a first value and to open in response to the timing signal having a second value, the switch isolation circuit comprising a switch isolation charge store, and a buffer circuit configured to receive power from the switch isolation charge store and coupled between the timing signal and the protected switch, wherein the switch isolation circuit is configured to:
in response to the timing signal having the first value, operate in a powered mode in which the switch isolation charge store is configured to receive power from the power input, and
in response to the timing signal having the second value, operate in an isolation mode in which the switch isolation charge store is isolated from the power input; and
power isolation circuitry comprising a power isolation charge store and configured to switch between a power receiving mode and a power isolation mode using the protected switch, wherein in the power receiving mode the power isolating charge store is coupled to the power input and is electrically isolated from the power output, and in the power isolation mode the charge store is coupled to the power output and is electrically isolated from the power input.

2. The apparatus of claim 1, wherein the buffer circuit is configured to receive power from the switch isolation charge store independent of whether the switch isolation circuit is operating in the powered mode or the isolation mode.

3. The apparatus of claim 1, wherein:
the timing signal is an input side timing signal, the switch isolation circuit is an input side switch isolation circuit of a plurality of switch isolation circuits, and the protected switch is an input side protected switch coupled between the power input and a first terminal of the power isolation charge store;
the apparatus further comprises an output side protected switch coupled between the first terminal of the power isolation charge store and the power output, and an output side switch isolation circuit to provide isolation between the power input and the output side protected switch; and
the output side protected switch is configured to close in response to the output side timing signal having the first value and to open in response to the output side timing signal having the second value.

4. The apparatus of claim 3, further comprising timing circuitry to generate the input side timing signal and the output side timing signal from a common clock signal,
wherein the timing control circuitry is configured to cause the input side timing signal to have the second value when the output side timing signal has the first value, and to cause the output side timing signal to have the second value when the input side timing signal has the first value.

5. The apparatus of claim 3, wherein the apparatus further comprises a shorting protected switch coupled between the first terminal of the power isolation charge store and a second terminal of the power isolation charge store, and a shorting isolation circuit to provide isolation between the power input and the shorting protected switch; and
the shorting protected switch is configured to close in response to the shorting timing signal having the first value and to open in response to the shorting timing signal having the second value.

6. The apparatus of claim 5, further comprising timing circuitry to generate the input side timing signal, the output side timing signal, and the shorting timing signal from a common clock signal, wherein the timing control circuitry is configured to:
when the input side timing signal has the first value, cause the output side timing signal to have the second value, and cause the shorting timing signal to have the second value;
when the output side timing signal has the first value, cause the input side timing signal to have the second value, and cause the shorting timing signal to have the second value; and
when the shorting timing signal has the first value, cause the output side timing signal to have the second value, and cause the input side signal to have the second value.

7. The apparatus of claim 3, wherein:
the power input comprises a first input power signal and a second input power signal;
the input side protected switch is a first input side protected switch coupled between the first terminal of the power isolation charge store and the first input power signal; and the power isolation circuit further comprises a second input side protected switch operating in phase with the first input side protected switch and coupled between a second terminal of the power isolation charge store and the second power signal.

8. The apparatus of claim 3, wherein:
the power output comprises a first output power signal and a second output power signal;
the output side protected switch is a first output side protected switch coupled between the first terminal of the power isolation charge store and the first output power signal; and
the power isolation circuit further comprises a second output side protected switch operating in phase with the first output side protected switch and coupled between the second terminal of the power isolation charge store and the second power signal.

9. The apparatus of claim 1, further comprising protected circuitry configured to receive power from the power output.

10. The apparatus of claim 1, wherein the power isolation circuit operates as a low frequency isolation circuit.

11. The apparatus of claim 1, comprising a further power isolation circuit coupled between the power isolation circuit and the power output and configured to output an output voltage signal at the power output of lower voltage than an intermediate voltage signal output from the power isolation circuit, wherein the further power isolation circuit is configured to generate the output voltage signal by filtering the intermediate voltage signal to reduce signal components at a switching frequency of the protected switch.

12. The apparatus of claim 11, further comprising timing generation circuitry to generate the timing signal, wherein the timing generation circuitry comprises a linear feedback shift register to cause a variation in a switching frequency of the timing signal between a minimum switching frequency and a maximum switching frequency.

13. The apparatus of claim 12, wherein the further power isolation circuit is configured as a band pass filter with a pass band based on a difference between the minimum switching frequency and the maximum switching frequency.

14. The apparatus of claim 1, wherein the power isolation circuit is one of a plurality of power isolation circuits each comprising a protected switch operated by the switch isolation circuit.

15. The processing apparatus of claim 1, wherein the protected switch is a CMOS switch.

16. The processing apparatus of claim 1, wherein the protected switch is coupled to a current pathway and a leakage current associated with the protected switch is correlated with a processing state of protected circuitry comprising the protected switch.

17. A non-transitory computer-readable medium storing computer-readable code for fabrication of an apparatus comprising:
a power input;
a power output;
a switch isolation circuit to provide isolation between the power input and a protected switch configured to close in response to a timing signal having a first value and to open in response to the timing signal having a second value, the switch isolation circuit comprising a switch isolation charge store, and a buffer circuit configured to receive power from the switch isolation charge store and coupled between the timing signal and the protected switch, wherein the switch isolation circuit is configured to:

in response to the timing signal having the first value, operate in a powered mode in which the switch isolation charge store is configured to receive power from the power input; and in response to the timing signal having the second value, operate in an isolation mode in which the switch isolation charge store is isolated from the power input; and power isolation circuitry comprising a power isolation charge store and configured to switch between a power receiving mode and a power isolation mode using the protected switch, wherein in the power receiving mode the power isolating charge store is coupled to the power input and is electrically isolated from the power output, and in the power isolation mode the charge store is coupled to the power output and is electrically isolated from the power input.

18. A method of operating an apparatus comprising a power input, a power output, a switch isolation circuit, and power isolation circuitry comprising a power isolation charge store, the method comprising:

providing isolation between the power input and a protected switch configured to close in response to a timing signal having a first value and to open in response to the timing signal having a second value, the isolation comprising a switch isolation charge store, and a buffer circuit configured to receive power from the switch isolation charge store and coupled between the timing signal and the protected switch;

operating the switch isolation circuit, in response to the timing signal having the first value, in a powered mode in which the switch isolation charge store receives power from the power input;

operating the switch isolation circuit, in response to the timing signal having the second value, in an isolation mode in which the switch isolation charge store is isolated from the power input; and switching the power isolation circuitry between a power receiving mode and a power isolation mode using the protected switch, wherein in the power receiving mode, the power isolating charge store is coupled to the power input and is electrically isolated from the power output, and in the power isolation mode, the charge store is coupled to the power output and is electrically isolated from the power input.

\* \* \* \* \*